United States Patent

Pahr

[11] Patent Number: 5,949,597
[45] Date of Patent: Sep. 7, 1999

[54] METHOD AND APPARATUS FOR DATA PULSE QUALIFICATION WHEREIN THE AMPLITUDE OF A PRECEDING PULSE OF OPPOSITE POLARITY IS TRACKED

[75] Inventor: Per Olaf Pahr, Lier, Norway

[73] Assignee: Tandberg Data Storage A/S, Oslo, Norway

[21] Appl. No.: 08/637,183

[22] Filed: Apr. 24, 1996

[51] Int. Cl.$^6$ ................................................ G11B 05/09
[52] U.S. Cl. ............................................. 360/46; 360/65
[58] Field of Search .................................. 360/78.02, 46, 360/65, 39, 70, 77.02, 62, 77.06, 113, 73.07; 371/40.14; 327/30, 443, 73, 101; 324/127; 341/132, 155; 318/678, 719, 811, 254

[56] References Cited

U.S. PATENT DOCUMENTS

| | | | |
|---|---|---|---|
| 4,130,844 | 12/1978 | Klinger | 360/77.02 |
| 4,399,474 | 8/1983 | Coleman, Jr. | 360/46 |
| 4,646,175 | 2/1987 | Sokolik et al. | 360/78.02 |
| 4,656,420 | 4/1987 | Felleisen et al. | 360/31 X |
| 4,837,642 | 6/1989 | Smidth | 360/46 |
| 5,298,901 | 3/1994 | Lekmine et al. | 341/155 |
| 5,363,100 | 11/1994 | Bailey et al. | 341/132 |
| 5,384,790 | 1/1995 | Tollum | 371/40.14 |
| 5,495,368 | 2/1996 | Blatchley et al. | 360/46 |
| 5,615,223 | 3/1997 | Carr | 360/46 X |

OTHER PUBLICATIONS

Circuit for detector/monitor stage of TDC 4100 streamer, of Tandberg Data ASA, Oslo, Norway.

Primary Examiner—Aristotelis M. Psitos
Assistant Examiner—Patrick Wamsley
Attorney, Agent, or Firm—Hill & Simpson

[57] ABSTRACT

In a method and apparatus for qualifying peaks in a signal as representing data bits, the signal containing data bits superimposed with background signals, a peak is qualified as representing a data bit when a first derivative of the peak exceeds a threshold value simultaneously with the original signal exceeding a positive or negative threshold of a hysteresis comparator. The respective positive and negative thresholds of the hysteresis comparator are alternatingly and continually adjusted by setting the negative hysteresis threshold dependent on the amplitude of a most recent positive peak in the incoming signal, and setting the positive hysteresis threshold dependent on the amplitude of a most recent negative peak in the incoming signal.

14 Claims, 6 Drawing Sheets

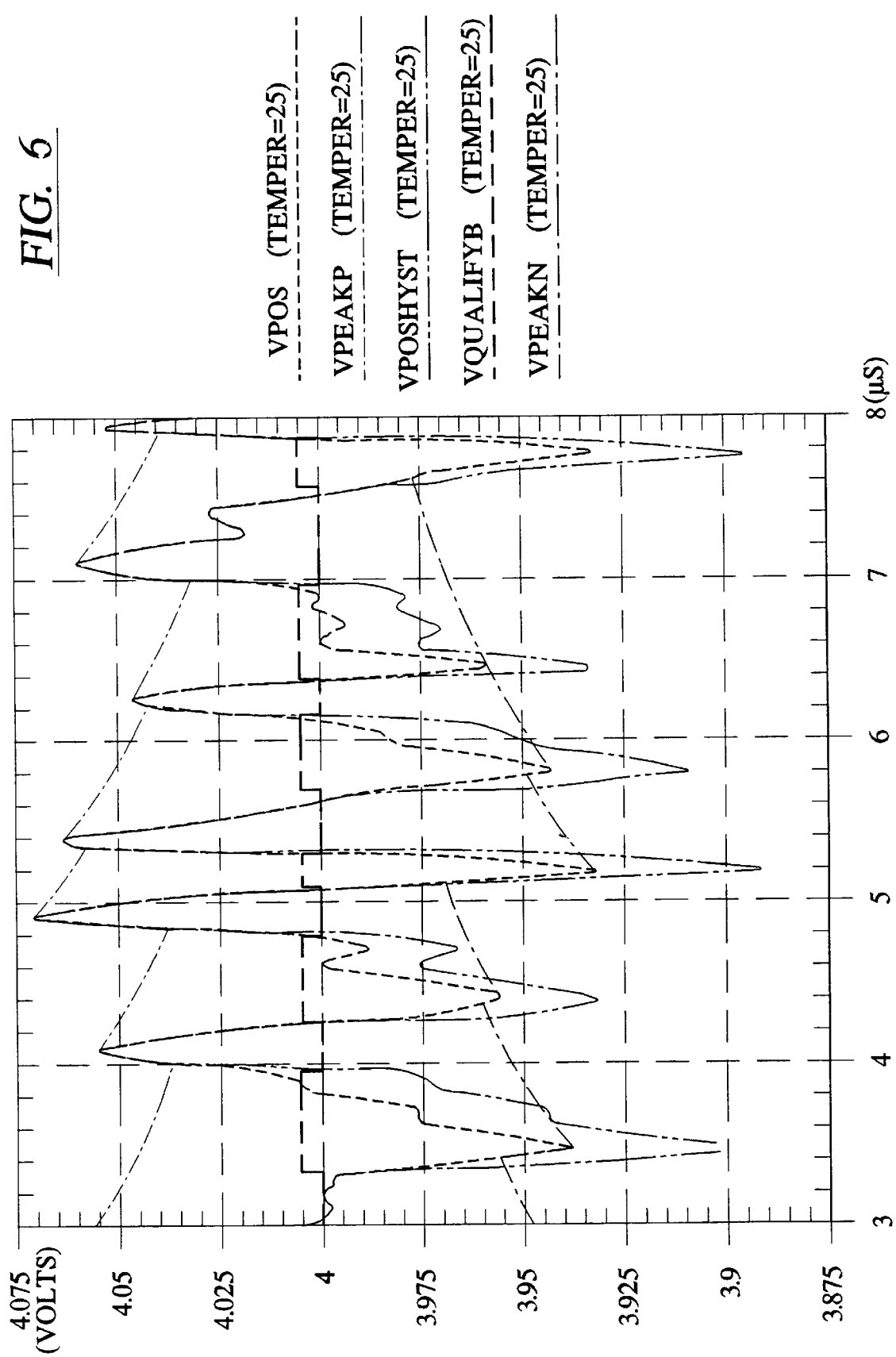

METHOD AND APPARATUS FOR DATA PULSE QUALIFICATION WHEREIN THE AMPLITUDE OF A PRECEDING PULSE OF OPPOSITE POLARITY IS TRACKED

BACKGROUND OF THE INVENTION

1. Field of the Invention

The present invention is directed to an improved signal peak detector data qualification method and apparatus for reading data stored on a magnetic storage medium.

2. Description of the Prior Art

Peak detectors for magnetic storage devices are well known in the art and have the following general attributes in common. To detect the correct position in time of a data pulse read from a magnetic medium (tape or disk) and embedded in noise, the peak of the pulse must be qualified as being produced by a valid data pulse, since there are several disturbing peaks arising from noise or misequalization in the data channel itself. The pulse signal is therefore split into two parts. One part is differentiated so that a zero-crossing can be detected by a comparator to give the correct position in time of the peak of the pulse. Unfortunately, this gives rise to several other zero-crossing minor pulses which may be located in time close to the main signal pulse or at time positions where there are no pulses in the data signal itself. The other part of the pulse signal is not differentiated and its large amplitude can, if it is correctly equalized and occurs within a short time interval on both sides of its peak, be used to qualify the zero-crossing. To generate such a qualifying pulse, the pulse amplitude must exceed a certain level i.e. a threshold. This is implemented using a comparator with hysteresis, because in magnetic recording the signal pulses always have alternating polarities (e.g., +1 and −1 nominal normalized peaks), whereas the noise pulses do not. The qualifying hysteresis comparator therefore must inherently have both positive and negative thresholds which must be exceeded before the comparator can change its state. These thresholds are hence used by subsequent logic circuits to filter out the noise or unwanted zero-crossings generated by the comparator which responds to the differentiated peaks.

The threshold of the qualifying comparator is normally set at a low level so that variations in the peak amplitude can be tolerated. This is a compromise. The thresholds must be above the noise levels in the data channel, otherwise a "soft" error will occur due to noise. The threshold must likewise be above the small peaks caused by misequalization, otherwise a "hard" read error may occur (such errors may be partly circumvented using error correction techniques). As the pulse densities on the magnetic storage medium become higher and the read head gap is made smaller, however, individual variations of the pulse amplitude are more likely to occur due to increased sensitivity of the read gap to medium distance losses. These are known as signal dropouts.

For this reason, the use of an adaptive signal threshold which depends on the actual pulse levels has become known in the art. When the peak pulse amplitudes of the signal is gradually reduced during a signal partial dropout, the threshold follows the envelope of the-signal, i.e. the momentary threshold is set as a fixed percentage of the actual signal envelope. Rectifiers with an associated decay time of their output envelope signal are used for this purpose. The decay time must be set to be at least as short as the fastest signal dropouts occurring in the read channel. By doing this, the error rates of conventional data peak detectors can be reduced by at least one or two orders of magnitude in some systems.

SUMMARY OF THE INVENTION

It is an object of the present invention to provide an improved method and apparatus for qualifying signals using an adaptive threshold is therefore sought for.

The present invention is based on the following observations.

When using magnetoresistive (MR) read heads and magnetic tapes wherein the magnetic medium is composed of very small particles (in contrast to a magnetic thin film medium wherein a magnetic thin film is deposited by evaporation from a source material in a vacuum chamber), signal dropouts from the particulate tape are not as regular as with thin film media or from particulate tape using inductive read heads. Partial signal dropouts are typically of a shorter duration and they do not always have an ideal exponential nature.

When using run-length limited (RLL) codes, especially the (1,7) 2/3-rate code where (d,k)=(1,7), meaning that there always is at least "d" zeros and a maximum of "k" zeros between the +1 and −1 pulses (or between the −1 and +1 pulses), the update rate for the signal envelope is lower than with other codes with smaller k-values, for example the (0,2) 4/5-rate GCR often used in tape drives.

Further, the inherent nonlinear signal response of magnetoresistive read heads also causes a deviation in amplitude from the ideal "+1" and "−1" pulses. For this reason, two half-wave rectifiers must be used to fully optimize the MR pulses. The MR sense current used to set the magnetic field bias point for the MR read element must be adjusted based on observations of both the positive and negative pulses, and the sense current is adjusted to give the best possible output signal symmetry.

Then, if one uses the positive peak rectifier output to set the positive threshold hysteresis and the negative peak rectifier output to set the negative threshold hysteresis, the update rate of the corresponding envelope signals will be only half of what it would be with a full-wave rectifier. A worst-case signal sequence consists of a +1 pulse followed by seven zeroes and a −1 pulse which again is followed by seven zeroes. Then the update rate when using a half-wave rectifier will be fifteen symbols away when the next +1 pulse is about to arrive.

The invention recognizes the need for faster updating of the signal qualifying hysteresis thresholds. It does so by using two half-wave rectifiers. The threshold signal from the rectifier used for the negative peak pulses updates the threshold for the positive signal pulse. The threshold signal from the rectifier used for the positive pulses updates the threshold for the negative signal pulse. The inventive method and apparatus thus make use of alternating positive and negative thresholds. By doing so, the worst-case update rate is reduced from fifteen to seven symbol intervals, which gives a remarkable improvement in the ability of the system to follow fast signal dropouts, because the great advantage with using this approach is that the decay time for the threshold signal can be made shorter. Further, by doing so it is guaranteed that the peak which is about to be qualified is not disturbed by a changing hysteresis level, as could be the case if the threshold level was produced-from a full-wave rectifier or from a half wave rectifier operating on the same polarity of the pulse. Even further, in one embodiment of the invention, the thresholds are individually adjustable for the positive and negative peaks.

In another embodiment, they have a common adjustment value.

BRIEF DESCRIPTION OF THE DRAWINGS

FIG. 6 shows, using the same signal as in FIG. 5, the operation of the invention when the qualifying comparator during a short but temporary drop in the signal level receives hysteresis updates from the preceding pulses of opposite polarity.

DESCRIPTION OF THE PREFERRED EMBODIMENTS

Figure 1:
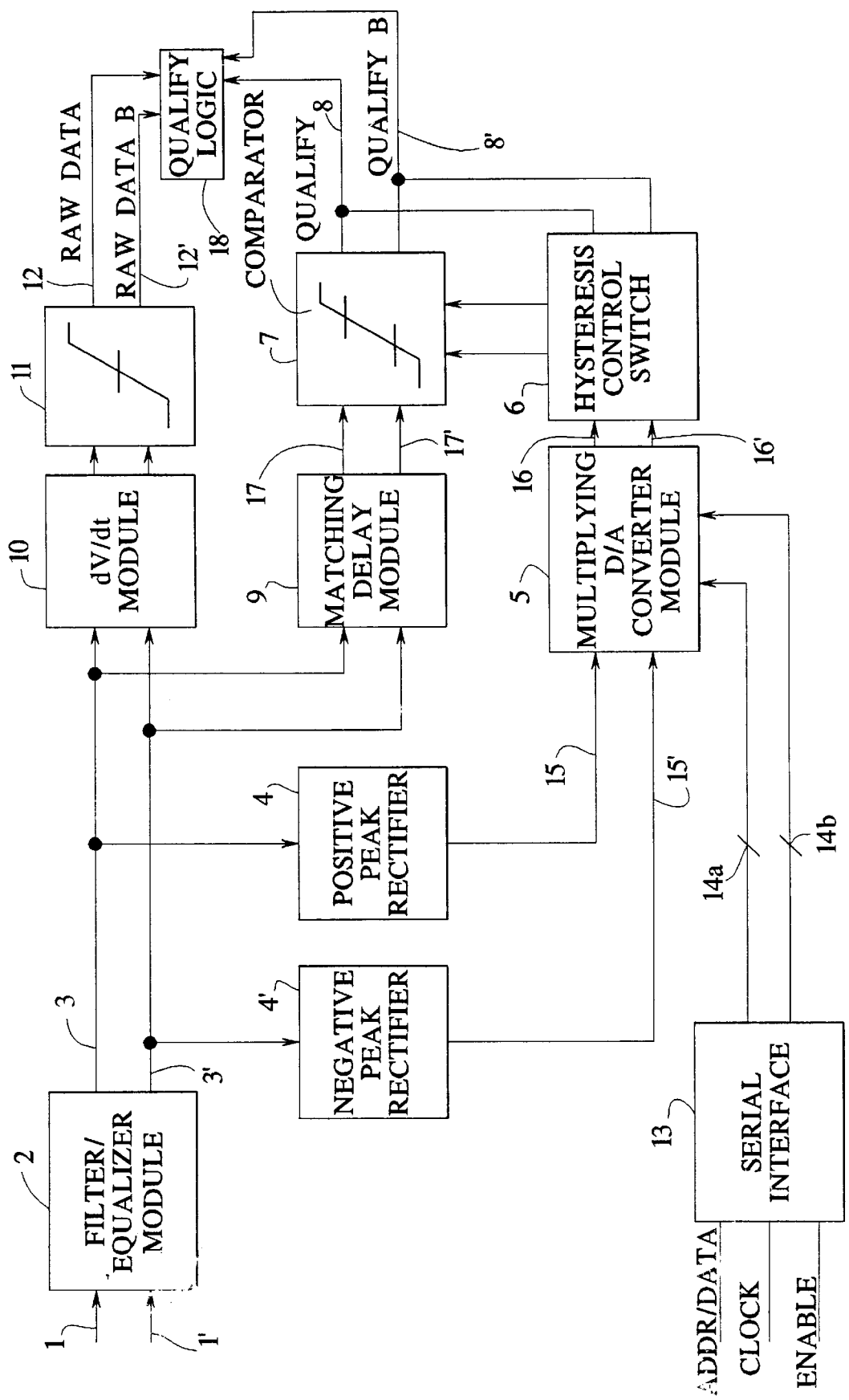
FIG. 1 shows a basic block diagram for a peak detector constructed and operating in accordance with the principles of the present invention.

FIG. 1 is a basic block diagram illustrating the timing and qualifying part of a peak detecting read channel for magnetic recording in accordance with the invention. A differential signal is applied at the input 1 and 1' of the filter and equalizer module 2. It is understood that known level or gain control is applied before this module 2, for example automatic gain control (AGC). This is not shown as it is well known in the art. Module 2 typically consists of a low pass filter and an equalizer. The equalized signals 3 and 3' are supplied to a module 10 wherein the signal is differentiated to obtain the first derivative of the equalized signals 3 and 3' so that the timing for pulse peaks can be extracted in the form of zero crossings detected by the comparator module 11. The signal name for these zero crossings has been chosen as "RAWDATA", lines 12 and 12', to indicate that this signal must be further processed in a known qualify logic module 18 together with a qualifying signal QUALIFY on line 8 and QUALIFYB on line 8', to give a pulse stream where "+1" and "−1" peaks are transformed into "high" value signals. The basic operation of the qualify logic module 18 is to insure that a qualified "+1" must be followed by either a "0" or a "−1", not another "+1". In the same way, a qualified "−1" must either be followed by a "0" or a "+1", not another "1".

As mentioned above, two half-wave rectifiers 4 and 4' must be used anyway to fully optimize the symmetry of the inherent nonlinear MR pulses. Although not shown in FIG., 1, the output 15 of the positive peak rectifier 4 and the output 15' of the negative peak rectifier 4' are used for this purpose as well. In FIG. 1, these signals 15 and 15' are used, after proper scaling in a multiplying D/A converter module 5, to dynamically control the hysteresis of the hysteresis comparator 7. It should be noted from FIG. 1 that the hysteresis comparator 7 has two complementary output signals, QUALIFY (8) and QUALIFYB (8'). These signals are supplied to the hysteresis control switch 6. The operation of this switch 6 will be evident by the details shown in FIG. 3.

Its basic operation is to use the control signals QUALIFY (8) and QUALIFYB (8') to switch-the hysteresis for module 7 between the scaled positive peak rectified signal 16 and the negative peak rectified signal 16', described in more detail in connection with FIG. 2 and FIG. 3.

In FIG. 1, the multiplying D/A converter module 5 scales the rectified signals 15 and 15'. This is done by using two multiplying digital-to-analog converters (D/A) where the digital input(s) are provided by a prior art serial interface 13, via control lines 14a and 14b. These lines are not complementary signals. If a common scaling factor is used, only line 14a is necessary.

Further, in FIG. 1, one can see that the equalized signals 3 and 3' passes a matching delay module 9 before the analog qualify signal arrives at the hysteresis comparator module 7. This is done to obtain, as nearly as possible, a matching between the timing and qualify signals when these signals arrive at their comparators 11 and 7, respectively.

Figure 2:
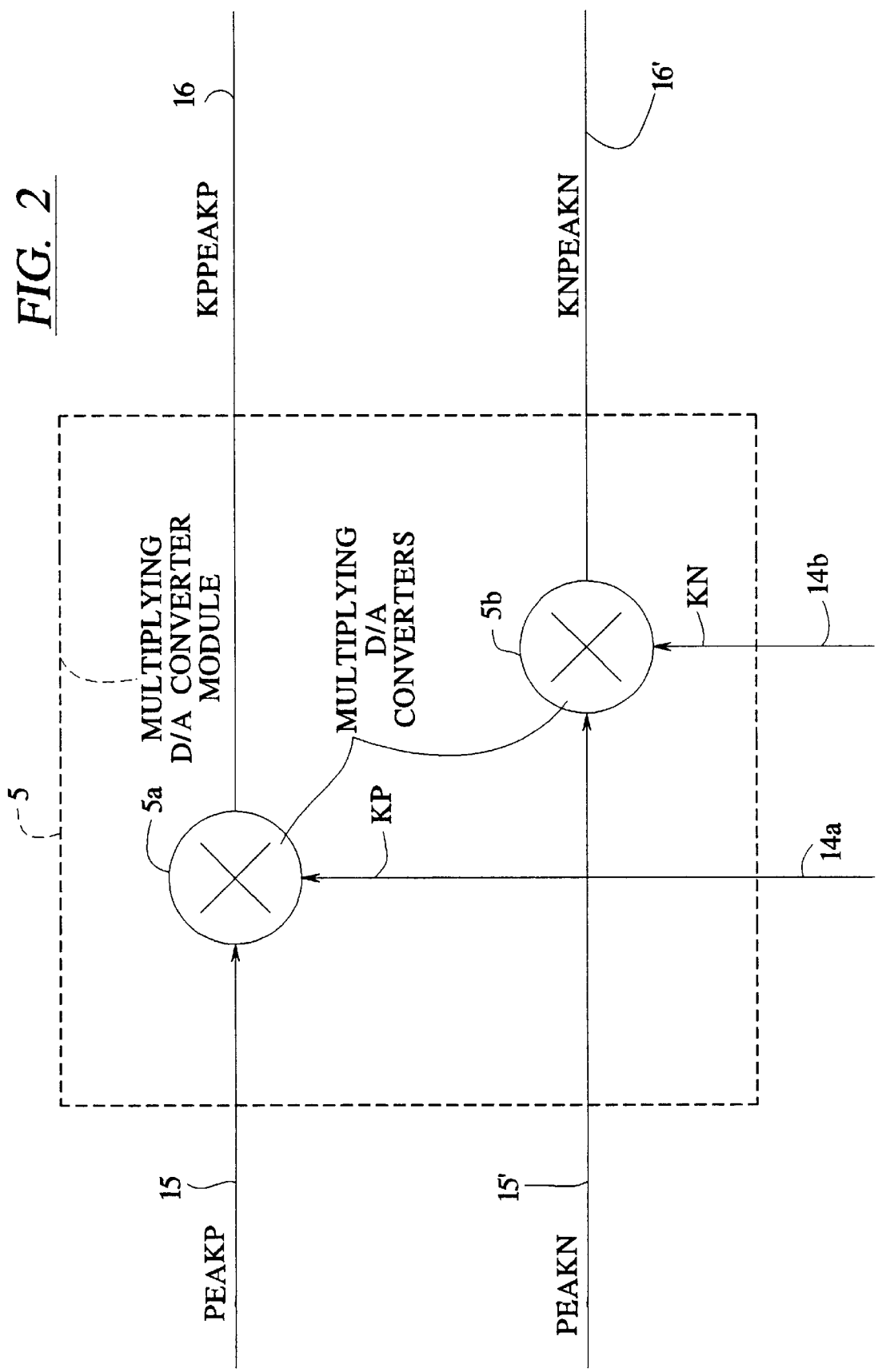
FIG. 2 shows details of the multiplying D/A converters in FIG. 1, wherein scaling factors are given to the threshold signals for both the positive and negative peaks.

FIG. 2 shows the multiplying D/A converter module 5, which includes two conventional multiplying D/A converters 5a and 5b. An input signal, which is the same signal as PEAKP on line 15 in FIG. 1 is supplied to the converter 5a from the positive peak rectifier module 4 as well as a scaling, "static" but programmable signal KP on line 14a serving as a multiplication constant for the rectified positive peaks, the output signal on line 16. Similarly, the output PEAKN from the-rectified negative peaks from line 15' in FIG. 1 is multiplied by the factor KN from line 14b in FIG. 1, to give the signal KNPEAKN on output line 16'. As mentioned earlier, in one embodiment of the invention, KP=KN=K, i.e. a common scaling factor can also be used if the symmetry of the positive and negative pulses for the MR element is so good that it allows this to be done.

Figure 3:
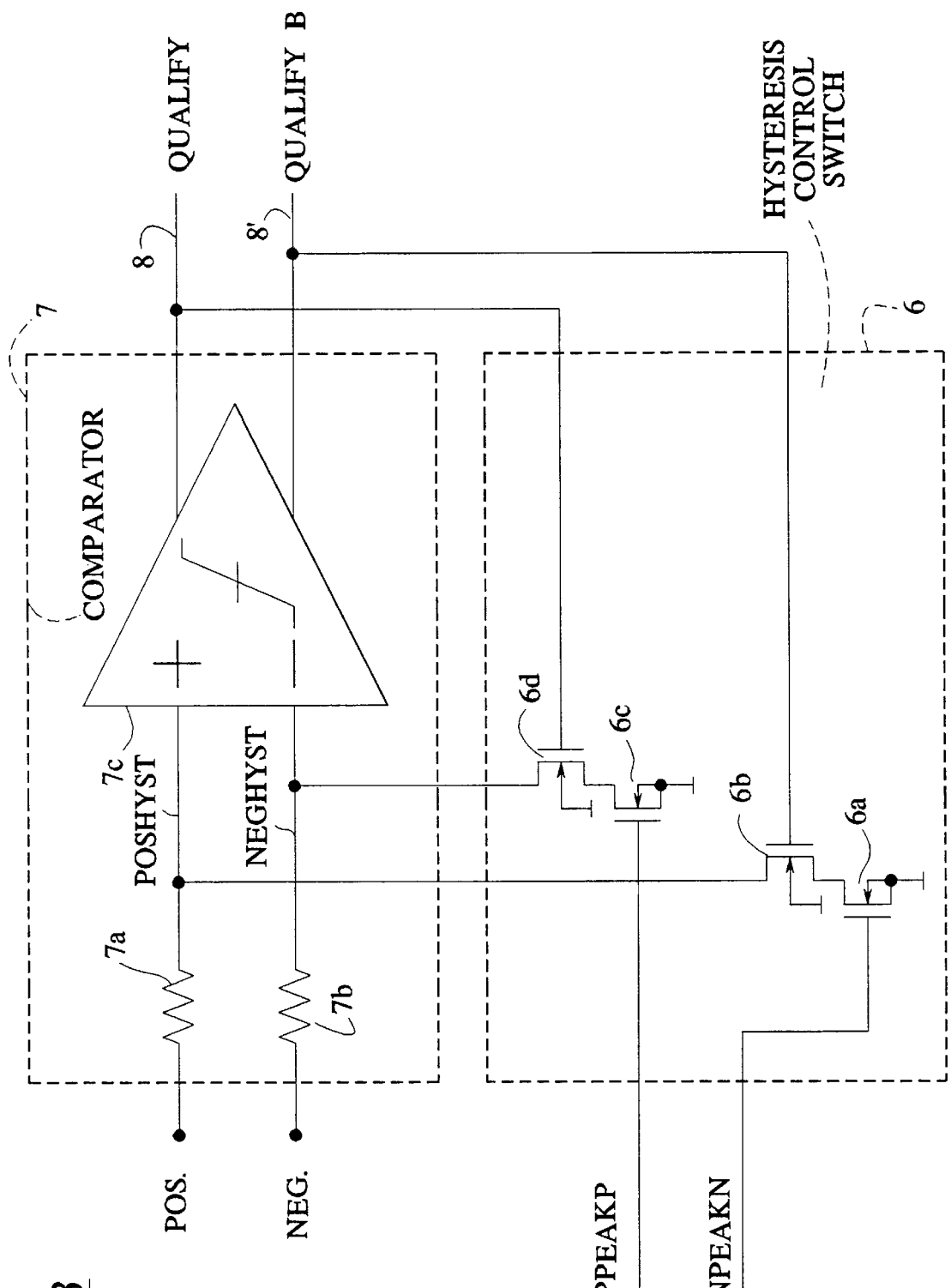
FIG. 3 illustrates the principle of a prior art hysteresis comparator, from which, together with FIGS. 1 and 2, one can see that the threshold signals from the rectified positive peaks set up the negative hysteresis and the threshold from the rectified negative peaks set up the positive hysteresis.

FIG. 3 shows a known hysteresis comparator which explains the invention by the way the signals from the rectified peaks are used to set up the hysteresis. The scaled hysteresis signal KPPEAKP (originating from the rectifier for the positive peaks) is transformed into a current by the transistor 6c and is supplied to the negative input NEGHYST of the voltage-sensing comparator with no hysteresis 7c. The current produced by transistor 6c when QUALIFY (8) goes "high", develop a voltage across resistor 7b, so that the product of the current and the resistor value gives the actual hysteresis voltage for the differential signal. At the same time as QUALIFY goes high, QUALIFYB (8') goes "low" and transistor 6b shuts off the hysteresis current originating from the rectifier for the negative peaks and produced by transistor 6a. If one thinks of a positive-going transition in the differential input signal POS minus NEG just before this switching event takes place, the hysteresis action is implemented by removing the voltage across the hysteresis resistor 7a. Hence a "high" level on QUALIFYB causes positive feedback for positive transitions. In the same way, for symmetry reasons, the QUALIFY signal causes positive feedback for negative transitions in the differential signal POS minus NEG at the input of module 7. This is further described in FIG. 4.

Figure 4:
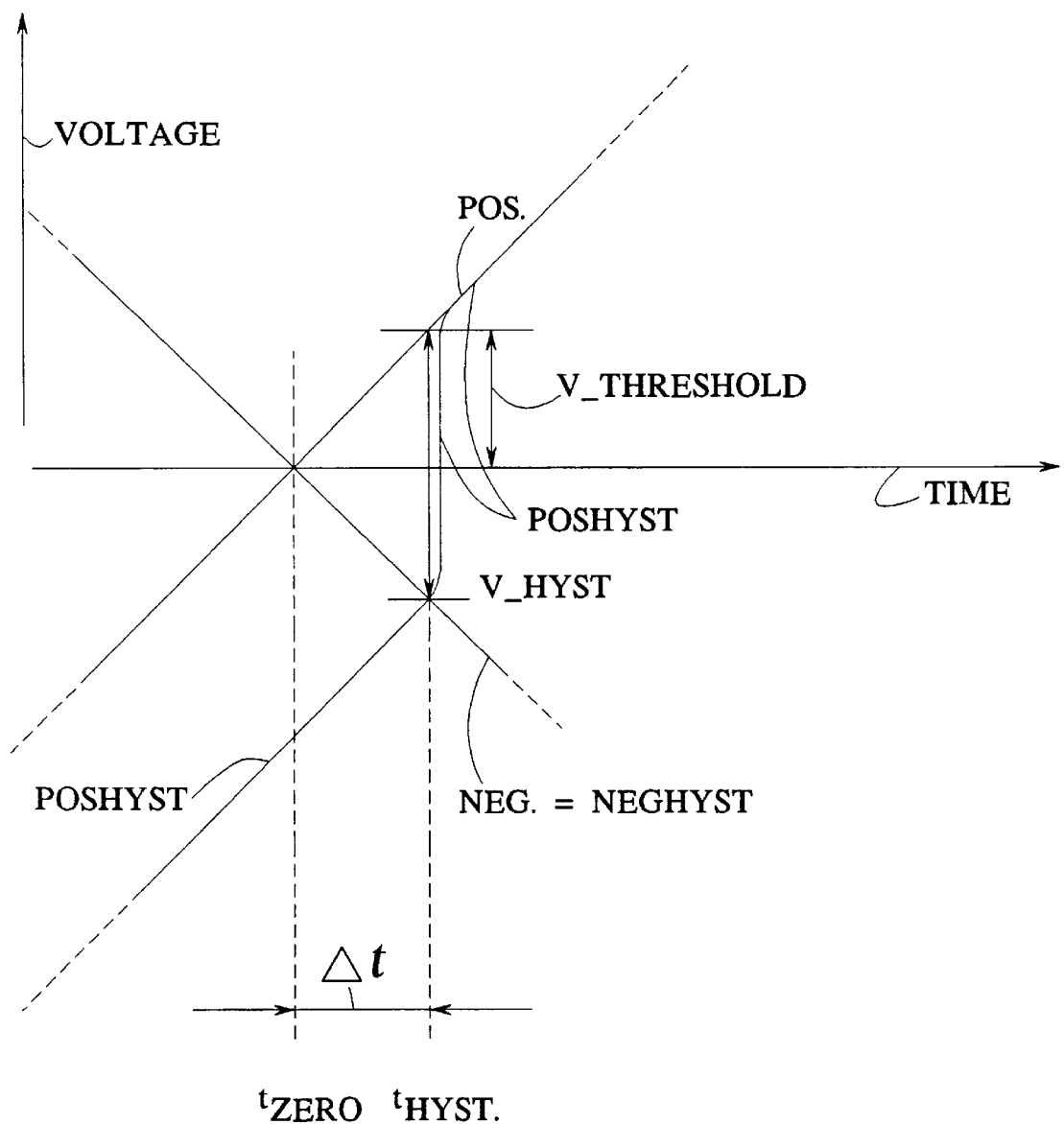
FIG. 4 illustrates the principal operation of a prior art threshold comparator and the relationship between the actual threshold set up for the comparator and the threshold signal itself.

FIG. 4 is a voltage vs. time diagram for the operation of the hysteresis comparator in FIG. 3 showing what happens for a positive-going transition in the differential signal POS minus NEG. Since the circuit in FIG. 3 operates with single-ended signals POS, POSHYST, NEG and NEGHYST, these single-ended signals have been shown in FIG. 4, i.e. the differential signal POS minus NEG is not shown. The comparator 7c (free of hysteresis by itself) in FIG. 3, "sees" only the differential signal POSHYST minus NEGHYST. Hysteresis is used to set a voltage threshold, V_THRESHOLD, in the single-ended signal POS. Hysteresis is produced by "pulling down" the positive input of the comparator 7c from POS to POSHYST prior to the time $t_{hyst}$. The voltage which must be applied to produce the hysteresis V_THRESHOLD is called V_HYST. Note that V_HYST=2V_THRESHOLD because the comparator sees the full differential signal POSHYST minus NEGHYST (=NEG, i.e. no hysteresis pull-down voltage is applied at NEGHYST for positive going transitions). At time $t_{hyst}$ NEGHYST and POSHYST are equal and the comparator responds by setting the QUALIFY signal "highs" and the QUALIFYB signal low, thereby turning off transistor 6b in FIG. 3. In FIG. 4 this event is illustrated by showing the POSHYST signal make a rapid increase to coincide with the POS signal at time $t_{hyst}$, giving positive feedback action around the comparator e.g.

Figure 5:
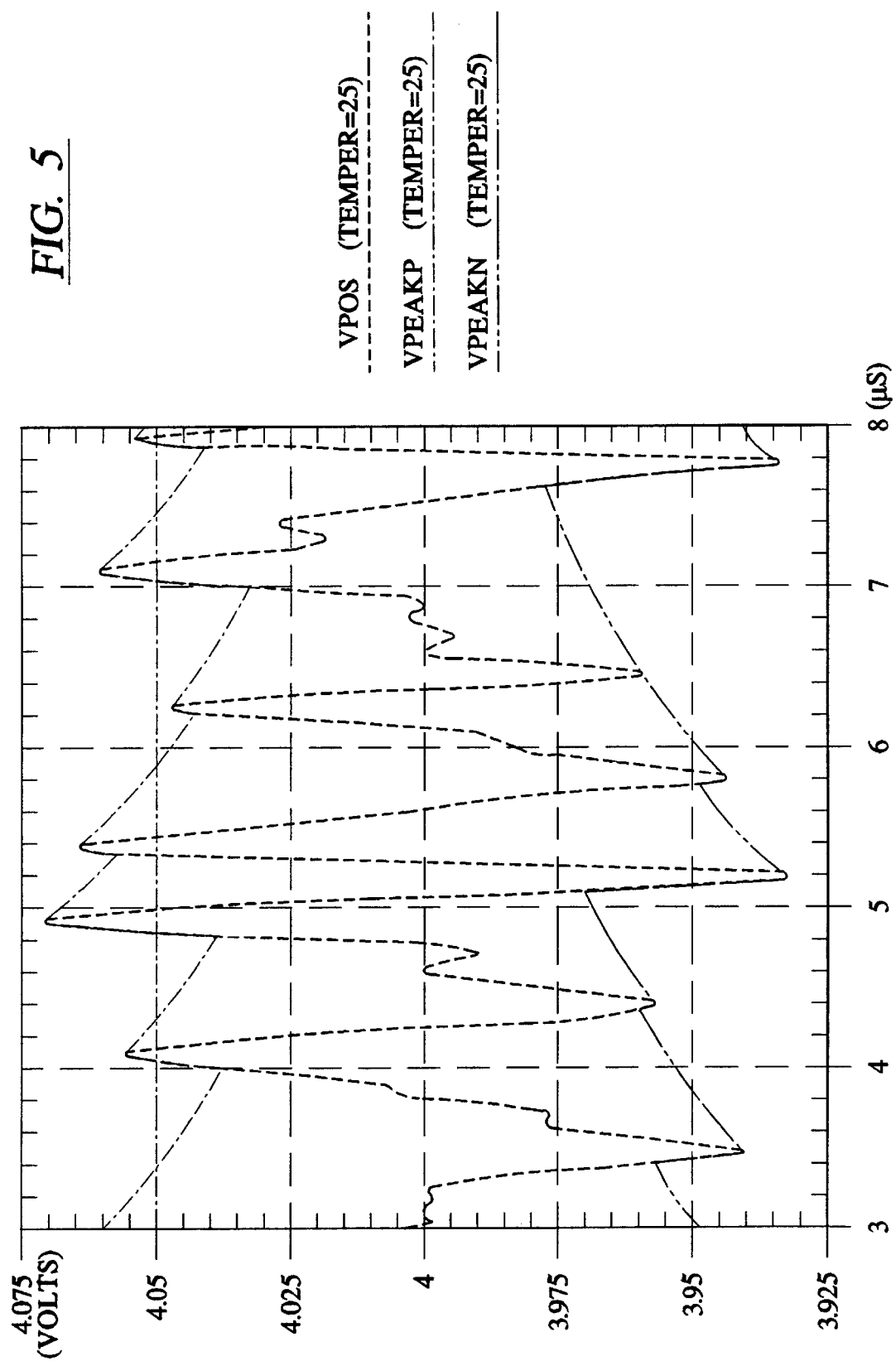
FIG. 5 shows real data waveforms and how they are treated by the method and apparatus of the invention, with peak detector waveforms with a short decay time constant of 2 μs superimposed thereon.

FIGS. 5 and 6 will be used to show how the invention significantly improves the ability of the data qualifying signal to follow fast changes in the incoming signal itself.

FIG. 5 shows how a real data signal POS from a MR head may appear during a partial but temporary signal level drop occurring at a time interval from about 5 μs to 7 μs. It can be seen how the rectified signal PEAKP from the positive peaks is able to follow the fast-changing signal level. The time constant is 2 μs. For illustrative purposes only and for simplicity, the output from the other rectifier PEAKN is folded down about the zero-level line 4 volts so that it can be seen how this signal follows the negative peaks in the POS signal. In the actual implementation, PEAKN has the same polarity as PEAKP, i.e. both are above the 4 volt level and both can produce positive currents only to the hysteresis resistors 7a and 7b in FIG. 3.

In FIG. 5, at times prior to 7 μs, the signal level has been reduced for both PEAKP and PEAKN. When the positive peak is about to arrive just after t=7 μs, it is not known if the level will still fall or if it will increase again. Thus, the best estimate for the level is the preceding level known from PEAKN to set up the threshold for the positive peak. When this positive pulse has arrived at 7.1 μs, however, it is then known that the signal level has been recovered and the level at PEAKP is used to set the threshold for the next negative peak which occurs just prior to time t=8 μs.

FIG. 6 shows in more detail how the invention works for positive thresholds only. In addition to the signals shown in FIG. 5, POSHYST and QUALIFYB have been shown. Positive thresholds are set when QUALIFYB is "high". For convenience QUALIFYB has been scaled down and placed just above the 4 volt line in FIG. 6. The threshold level has been set to 30% of the dynamic signals PEAKP and PEAKN by a common scaling factor K=KP=KN in FIG. 2. The dynamic nature of the threshold can be seen by varying degrees of pull-down voltage applied to POSHYST. This is, for example, evident by how far down the negative peaks of POSHYST are pulled. Just prior to time t=7 μs, the PEAKN level is approaching the zero-signal-line at 4 volts quickly and the threshold is set as a percentage of this estimated level. When the high peak arrives at about t=7.1 μs, the actual threshold therefore will be lower. It can therefore be seen that the negative transition in the QUALIFYB signal occurs early and just prior to t=7 μs. If this positive peak had been small, it would have been crucial to adapt to a smaller threshold but not so small that the threshold comparator would have responded to the minor positive peak (which actually is caused by misequalization) occurring at time t=6.8 μs in FIG. 6. If the threshold had been set too low or the time constant too short, a data error would have occurred at t=6.8 μs, since the qualifying logic which operates on the RAWDATA and QUALIFY signals is actually allowing for and waiting for a positive peak to occur after a negative one. As the positive peak arrives at t=7.1 μs, the next threshold level for the negative peak is updated to a higher level, which is visible in FIG. 6 by the fact that QUALIFYB signal goes high late relative to the time of the zero-crossing of the POS signal itself.

Another aspect of the invention mentioned earlier is that the use of alternating threshold levels ensures that the sampling of the level does not disturb the hysteresis. For example, in FIG. 6, when the positive peak occurs at t=7.1 μs, the hysteresis decays smoothly since it was set at an earlier sampling time by the pulse of negative polarity. In other techniques, wherein either a full wave rectifier is used or wherein the output from a half wave rectifier is used to set the threshold dependent on pulses of the same polarity as measured by the same half wave rectifier, oscillations may occur if the time constant are made too short, since the hysteresis level may change at the same time as the comparator is about to respond. This may also cause a secondary effect, i.e., the response time of a typical non-ideal comparator may also change due to reduced overdrive of the comparator, causing an increased transition delay in the comparator.

It is also important to note that the changes in signal level seen in FIG. 5 and FIG. 6 are short-term changes. They are caused partly by small perturbations in the particulate magnetic media giving variations in the pulse peak levels, partly are they caused by misequalization, which may be used to improve the overall signal-to-noise ratio in the QUALIFY signal. The invention is therefore able to improve the error rates much more than may a first be apparent if one considers only conventional signal "dropouts". Other circuitry using dynamic thresholds is usually designed to follow signal dropouts with much longer time constants than can be done with the present method. The ability to alternate are between positive and negative thresholds is important because such short term changes in signal levels are occurring at a high rate compared with the low rate of more conventional signal dropouts.

This is further emphasized by the fact that AGC systems can not compensate for these short-term changes in signal levels. For example, the signal waveform POS shown in FIGS. 5 and 6 is the signal after it has been processed by a relative fast AGC. Even if the AGC were made faster than what was used in FIG. 5 and FIG. 6, AGC would not have been of much use for these short-term signal variations, since the AGC is implemented by a feedback system with an amplifier is normally placed in front of the equalizer filter module 2 in FIG. 1, causing a signal delay to occur. By using the feed forward approach shown in FIG. 1 and using threshold level samples from pulses of alternating polarities, a better result is obtained.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for operating a hysteresis comparator having an adjustable positive hysteresis threshold comprising the steps of:

providing first and second equalized signals, each having an amplitude with successively occurring peaks;

continually identifying respective amplitudes of successive positive peaks of said first equalized signal;

continually identifying respective amplitudes of successive negative peaks of said second equalized signal;

supplying said first and second equalized signals to said hysteresis comparator;

alternatingly and continually adjusting said positive and negative hysteresis thresholds of said hysteresis comparator by setting said negative hysteresis threshold dependent on the amplitude of a most recent positive peak and setting said positive hysteresis threshold dependent on the amplitude of a most recent negative peak; and generating an output signal from said hysteresis comparator dependent on the respective amplitudes of said first and second equalized signals relative to said positive and negative hysteresis thresholds.

2. A method as claimed in claim 1 wherein the step of continually identifying respective amplitudes of successive positive peaks of said first equalized signal comprises:

positively half-wave rectifying said first equalized signal to obtain a rectified first differential signal containing said successive positive peaks, and multiplying said rectified first equalized signal by a first scaling factor; and wherein the step of continually identifying respective amplitudes of successive negative peaks of said second equalized signal comprises:

negatively half-wave rectifying said second equalized signal to obtain a rectified second equalized signal containing said successive negative peaks, and multiplying said rectified second equalized signal by a second scaling factor.

3. A method as claimed in claim 2 wherein said first scaling factor is equal to said second scaling factor.

4. A circuit for operating a hysteresis comparator comprising:

a hysteresis comparator having an adjustable positive hysteresis threshold and an adjustable negative hysteresis threshold;

means for providing first and second equalized signals, each having an amplitude with successively occurring peaks, said first and second differential signals being supplied to said hysteresis comparator;

means for continually identifying respective amplitudes of successive positive peaks of said first equalized signal;

means for continually identifying respective amplitudes of successive negative peaks of said second equalized signal;

hysteresis control means for alternatingly and continually adjusting said positive and negative hysteresis thresholds of said hysteresis comparator by setting said negative hysteresis threshold dependent on the amplitude of a most recent positive peak and setting said positive hysteresis threshold dependent on the amplitude of a most recent negative peak; and said hysteresis comparator comprising means for generating an output signal dependent on the respective amplitudes of said first and second equalized signals relative to said positive and negative hysteresis thresholds.

5. A hysteresis comparator as claimed in claim 4 wherein said means for continually identifying respective amplitudes of successive positive peaks of said first equalized signal comprises:

means for positively half-wave rectifying said first equalized signal to obtain a rectified first equalized signal containing said successive positive peaks, and means for multiplying said rectified first equalized signal by a first scaling factor; and wherein said means for continually identifying respective amplitudes of successive negative peaks of said second equalized signal comprises:

means for negatively half-wave rectifying said second equalized signal to obtain a rectified second equalized signal containing said successive negative peaks, and means for multiplying said rectified second equalized signal by a second scaling factor.

6. A hysteresis comparator as claimed in claim 5 wherein said means for multiplying said rectified second equalized signal by a second scaling factor comprises means for multiplying said rectified second equalized signal by a second scaling factor equal to said first scaling factor.

7. A method for qualifying peaks in a signal as representing data bits, said signal containing data bits superimposed with background signals, said method comprising the steps of:

providing first and second equalized signals, each having an amplitude with successively occurring peaks;

mathematically differentiating said first and second equalized signals to obtain a first differentiated signal comprising a first derivative of said first equalized signal and second differentiated signal comprising a first derivative of said second equalized signal;

supplying each of said first differentiated signal and said second differentiated signal to a single-threshold comparator and generating a first output signal from said single-threshold comparator when either of said first differentiated signal or said second differentiated signal exceeds a threshold of said single-threshold comparator;

continually identifying respective amplitudes of successive positive peaks of said first equalized signal;

continually identifying respective amplitudes of successive negative peaks of said second equalized signal;

supplying said first and second differential signals to a hysteresis comparator having an adjustable positive hysteresis threshold and an adjustable negative hysteresis threshold;

alternatingly and continually adjusting said positive and negative hysteresis thresholds of said hysteresis comparator by setting said negative hysteresis threshold dependent on the amplitude of a most recent positive peak and setting said positive hysteresis threshold dependent on the amplitude of a most recent negative peak;

generating a second output signal from said hysteresis comparator dependent on the respective amplitudes of said first and second equalized signals relative to said positive and negative hysteresis thresholds; and qualifying a peak in said first or second equalized signals as representing a data bit when said first and second output signals are both present.

8. A method as claimed in claim 7 wherein the step of continually identifying respective amplitudes of successive positive peaks of said first equalized signal comprises:

positively half-wave rectifying said first equalized signal to obtain a rectified first equalized signal containing said successive positive peaks, and multiplying said rectified first equalized signal by a first scaling factor; and wherein the step of continually identifying respective amplitudes of successive negative peaks of said second equalized signal comprises:

negatively half-wave rectifying said second equalized signal to obtain a rectified second equalized signal containing said successive negative peaks, and multiplying said rectified second equalized signal by a second scaling factor.

9. A method as claimed in claim 8 wherein said first scaling factor is equal to said second scaling factor.

10. A method as claimed in claim 7 wherein the step of mathematically differentiating said first and second differential signals has a time delay associated therewith, and said method comprising the additional step of:

delaying supplying said first and second equalized signals to said hysteresis comparator by a time delay equal to said time delay associated with mathematically differentiating said first and second equalized signals.

11. An apparatus for qualifying peaks in a signal as representing data bits, said signal containing data bits superimposed with background signals, said method comprising the steps of:

means for providing first and second equalized signals, each having an amplitude with successively occurring peaks;

means for mathematically differentiating said first and second equalized signals to obtain a first differentiated signal comprising a first derivative of said first equalized signal and a second differentiated signal comprising a first derivative of said second equalized signal;

a single-threshold comparator, to which each of said first differentiated signal and said second differentiated signal are supplied, for generating a first output signal when either of said first differentiated signal or said second differentiated signal exceeds a threshold of said single-threshold comparator;

means for continually identifying respective amplitudes of successive positive peaks of said first equalized signal;

means for continually identifying respective amplitudes of successive negative peaks of said second equalized signal;

a hysteresis comparator to which said first and second equalized signals are supplied, said hysteresis comparator having an adjustable positive hysteresis threshold and an adjustable negative hysteresis threshold;

means for alternatingly and continually adjusting said positive and negative hysteresis thresholds of said hysteresis comparator by setting said negative hysteresis threshold dependent on the amplitude of a most recent positive peak and setting said positive hysteresis threshold dependent on the amplitude of a most recent negative peak;

said hysteresis comparator comprising means for generating a second output signal dependent on the respective amplitudes of said first and second equalized signals relative to said positive and negative hysteresis thresholds; and logic means for qualifying a peak in said first or second equalized signals as representing a data bit when said first and second output signals are both present.

12. An apparatus as claimed in claim 11 wherein said means for continually identifying respective amplitudes of successive positive peaks of said first equalized signal comprises:

means for positively half-wave rectifying said first equalized signal to obtain a rectified first equalized signal containing said successive positive peaks, and means for multiplying said rectified first equalized signal by a first scaling factor; and wherein said means for continually identifying respective amplitudes of successive negative peaks of said second equalized signal comprises:

means for negatively half-wave rectifying said second equalized signal to obtain a rectified second equalized signal containing said successive negative peaks, and means for multiplying said rectified second equalized signal by a second scaling factor.

13. An apparatus as claimed in claim 11 wherein said means for multiplying said rectified second equalized signal by a second scaling factor comprises means for multiplying said rectified second equalized signal by a second scaling factor equal to said first scaling factor.

14. An apparatus as claimed in claim 11 wherein said means for mathematically differentiating said first and second equalized signals has a time delay associated therewith, and said apparatus further comprising the additional step of:

means for delaying supply of said first and second equalized signals to said hysteresis comparator by a time delay equal to said time delay associated with said means for mathematically differentiating said first and second equalized signals.

* * * * *